(12) United States Patent
Satou et al.

(10) Patent No.: US 6,744,837 B1
(45) Date of Patent: Jun. 1, 2004

(54) CLOCK SWITCHING CIRCUIT

(75) Inventors: Hiroshi Satou, Chiba (JP); Sadaaki Tanaka, Chiba (JP); Takeshi Takahashi, Tokyo (JP); Yoshikatsu Uetake, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 662 days.

(21) Appl. No.: 09/650,673

(22) Filed: Aug. 30, 2000

(30) Foreign Application Priority Data

Aug. 30, 1999 (JP) ............................................. 11-243162

(51) Int. Cl.[7] ................................................. H04L 7/00
(52) U.S. Cl. ...................................... 375/372; 711/109
(58) Field of Search ................................ 375/371, 372, 375/373; 370/505; 711/109, 110, 211

(56) References Cited

U.S. PATENT DOCUMENTS

| | | | |
|---|---|---|---|
| 4,577,236 A | * 3/1986 | Takanashi | 386/2 |
| 4,630,034 A | * 12/1986 | Takahashi | 341/106 |
| 5,045,939 A | * 9/1991 | Okayama et al. | 348/445 |
| 5,113,456 A | * 5/1992 | Kimura et al. | 382/266 |
| 5,331,639 A | * 7/1994 | Takatori et al. | 370/506 |
| 5,365,468 A | * 11/1994 | Kakubo et al. | 708/313 |
| 5,659,356 A | * 8/1997 | Asaida et al. | 348/222.1 |
| 6,323,907 B1 | * 11/2001 | Hwang | 348/457 |
| 6,470,439 B2 | * 10/2002 | Yamada et al. | 711/215 |

* cited by examiner

Primary Examiner—Young T. Tse
(74) Attorney, Agent, or Firm—Venable LLP; Michael A. Sartori (57) ABSTRACT

In a clock switching circuit, a write address is generated based on a pre-switched clock, and the write address is employed to store input data in memory. Then, a read address is generated based on a post-switched clock, and the read address is employed to read data from memory, so that a clock synchronized with the data is changed. There are multiple pre-switched frequencies, and the frequency of a post-switched clock is higher than the frequency of a pre-switched clock. When the pre-switched clock frequency is lower than the post-switched clock frequency, the read address is updated in accordance with a ratio of the frequency of the pre-switched clock to the frequency of the post-switched clock.

18 Claims, 6 Drawing Sheets

FIG. 1

FIG. 2A INPUT CLOCK 1b (FREQUENCY B) — EXAMPLE WHERE A RELATIONSHIP BETWEEN FREQUENCIES A AND B OF INPUT CLOCK 1b IS A=4XB(n=2)

FIG. 2B INPUT DATA 1a — EXAMPLE WHERE A RELATIONSHIP BETWEEN FREQUENCIES A AND B OF INPUT CLOCK 1b IS A=4XB(n=2)

DO NOT REPRESENT PHASE RELATIONSHIP
DO NOT REPRESENT PHASE RELATIONSHIP

FIG. 2C SYSTEM CLOCK 1e (CORRESPONDING TO FREQUENCY A) — EXAMPLE WHERE A RELATIONSHIP BETWEEN FREQUENCIES A AND B OF INPUT CLOCK 1b IS A=4XB(n=2)

FIG. 2D OUTPUT DATA 1d — EXAMPLE WHERE A RELATIONSHIP BETWEEN FREQUENCIES A AND B OF INPUT CLOCK 1b IS A=4XB(n=2)

FIG. 2E VALIDITY INDICATION SIGNAL 1f — EXAMPLE WHERE A RELATIONSHIP BETWEEN FREQUENCIES A AND B OF INPUT CLOCK 1b IS A=4XB(n=2)

FIG. 3A INPUT CLOCK 1b (FREQUENCY A) — EXAMPLE WHERE A RELATIONSHIP BETWEEN FREQUENCIES A AND B OF INPUT CLOCK 1b IS $A = 2^n \times B$ (n IS A NATURAL NUMBER)

FIG. 3B INPUT DATA 1a — EXAMPLE WHERE A RELATIONSHIP BETWEEN FREQUENCIES A AND B OF INPUT CLOCK 1b IS $A = 2^n \times B$ (n IS A NATURAL NUMBER)

DO NOT REPRESENT PHASE RELATIONSHIP
DO NOT REPRESENT PHASE RELATIONSHIP

FIG. 3C SYSTEM CLOCK 1e (CORRESPONDING TO FREQUENCY A) — EXAMPLE WHERE A RELATIONSHIP BETWEEN FREQUENCIES A AND B OF INPUT CLOCK 1b IS $A = 2^n \times B$ (n IS A NATURAL NUMBER)

FIG. 3D OUTPUT DATA 1d — EXAMPLE WHERE A RELATIONSHIP BETWEEN FREQUENCIES A AND B OF INPUT CLOCK 1b IS $A = 2^n \times B$ (n IS A NATURAL NUMBER)

FIG. 3E VALIDITY INDICATION SIGNAL 1f — ACTIVE LEVEL (INDICATING ALL THE DATA ARE VALID)
EXAMPLE WHERE A RELATIONSHIP BETWEEN FREQUENCIES A AND B OF INPUT CLOCK 1b IS $A = 2^n \times B$ (n IS A NATURAL NUMBER)

FIG. 4

FIG. 5A INPUT CLOCK 2b (FREQUENCY D)
FIG. 5B INPUT DATA 2a
FIG. 5C SYSTEM CLOCK 2e (CORRESPONDING TO FREQUENCY C)
FIG. 5D OUTPUT DATA 2d
FIG. 5E VALIDITY INDICATION SIGNAL 2f

FIG. 6A INPUT CLOCK 2b (FREQUENCY C) — EXAMPLE WHERE A RELATIONSHIP BETWEEN FREQUENCIES C AND D OF INPUT CLOCK 2b IS x × C = y × D (x AND y ARE NATURAL NUMBERS, x<y)

FIG. 6B INPUT DATA 2a — b0 b1 b2 b3 b4 b5 b6 b7 b8 b9 — EXAMPLE WHERE A RELATIONSHIP BETWEEN FREQUENCIES C AND D OF INPUT CLOCK 2b IS x × C = y × D (x AND y ARE NATURAL NUMBERS, x<y)

DO NOT REPRESENT PHASE RELATIONSHIP
DO NOT REPRESENT PHASE RELATIONSHIP

FIG. 6C SYSTEM CLOCK 2e (CORRESPONDING TO FREQUENCY C) — EXAMPLE WHERE A RELATIONSHIP BETWEEN FREQUENCIES C AND D OF INPUT CLOCK 2b IS x × C = y × D (x AND y ARE NATURAL NUMBERS, x<y)

FIG. 6D OUTPUT DATA 2d — b0 b1 b2 b3 b4 b5 b6 b7 b8 b9 — EXAMPLE WHERE A RELATIONSHIP BETWEEN FREQUENCIES C AND D OF INPUT CLOCK 2b IS x × C = y × D (x AND y ARE NATURAL NUMBERS, x<y)

FIG. 6E VALIDITY INDICATION SIGNAL 2f — ACTIVE LEVEL (INDICATING ALL THE DATA ARE VALID) — EXAMPLE WHERE A RELATIONSHIP BETWEEN FREQUENCIES C AND D OF INPUT CLOCK 2b IS x × C = y × D (x AND y ARE NATURAL NUMBERS, x<y)

CLOCK SWITCHING CIRCUIT

BACKGROUND OF THE INVENTION

1. Field of the Invention

The present invention relates to a clock switching circuit for changing for input data a clock having a fixed phase to a clock having a different phase. The present invention can be applied, for example, for an elastic storage controller in a signal transceiver for an automatic switch.

2. Related Arts

Conventionally, a phase synchronization method using an elastic storage control method is employed for various types of bit phase synchronization circuits.

An overview of the elastic storage control method will now be given. In the communication of a signal between asynchronous systems, a reception side employs a clock received from a transmission side to temporarily store received data in a memory, and reads the data from the memory in the order in which they were received, in accordance with a system clock that is internally used on the reception side. Thus, on the reception side, the handling of the input data can be performed in synchronization with the system clock.

However, since it is a premise of a conventional condition that an input clock and a system clock should have the same clock frequency, one elastic storage controller handles only one clock frequency.

Specifically, unless the frequency of an input clock that is synchronized with input data is identical to the clock frequency that was set when the elastic storage controller was designed, the bit phase synchronization function is not performed satisfactorily, and only one type of relationship is established between the input clock and the system clock.

At the present time, when data are exchanged at various transmission speeds, signal transceivers that can handle such data (data for which different clock frequencies are used) have been developed; however, conventionally, a single elastic storage controller is not capable of adequately coping with data communications for which various clock frequencies are employed. In other words, a different elastic storage controller is required for each type of clock frequency used for input data.

This problem is also due to the lack of an elastic storage controller that can cope with situations wherein the clock frequencies of input data differ from the frequencies of system clocks, especially when the frequencies of the system clocks are higher.

Therefore, there is a demand for a clock switching circuit that can switch clocks even when the frequency of a post-switched clock is higher than a pre-switched clock.

There is also a demand for a clock switching circuit that can change several different clock frequencies for input data to a post-switched clock having a predetermined frequency.

SUMMARY OF THE INVENTION

To achieve the above objective of the present invention, according to a first aspect of the invention, a clock switching circuit comprises:

writing means for generating a write address based on a pre-switched clock, and for employing the write address to store input data in storage means; and reading means for generating a read address based on a post-switched clock that is independent of the pre-switched clock, and for employing the read address to read data from the storage means, thus changing a clock that is synchronized with the data, wherein the frequency of the post-switched clock is higher than the frequency of the pre-switched clock, and wherein, upon the receipt of the post-switched clock, the reading means updates or maintains the read address, in accordance with a ratio of the frequency of the pre-switched clock to the frequency of the post-switched clock.

According to a second aspect of the invention, a clock switching circuit comprises:

writing means for generating a write address based on a pre-switched clock, and for employing the write address to store input data in storage means; and reading means for generating a read address based on a post-switched clock that is independent of the pre-switched clock, and for employing the read address to read data from the storage means, thus changing a clock that is synchronized with the data, wherein a plurality of frequencies are employed for the pre-switched clock, and the frequency of the post-switched clock is equal to or higher than the highest frequency of the pre-switched clock, and wherein, when the frequency of the pre-switched clock that is input is lower than the frequency of the post-switched clock, upon the receipt of the post-switched clock the reading means updates or maintains the read address, in accordance with a ratio of the frequency of the input pre-switched clock to the frequency of the post-switched clock.

DETAILED DESCRIPTION OF THE PREFERRED EMBODIMENTS

(A) First Embodiment

An explanation will now be given, while referring to the accompanying drawings, for an elastic storage controller according to a first embodiment for which a clock switching circuit according to the present invention is applied.

For a system that processes, as a phase synchronization target, input data that, in accordance with the first embodiment, is synchronized using two different clock frequencies, the elastic storage controller implements a phase synchronization method when a powers of 2 relationship is established between the two clock frequencies ($A=2^n*B$ (n is a natural number) is established, where A and B denote input clock frequencies).

(A-1) Arrangement of the First Embodiment

Figure 1:
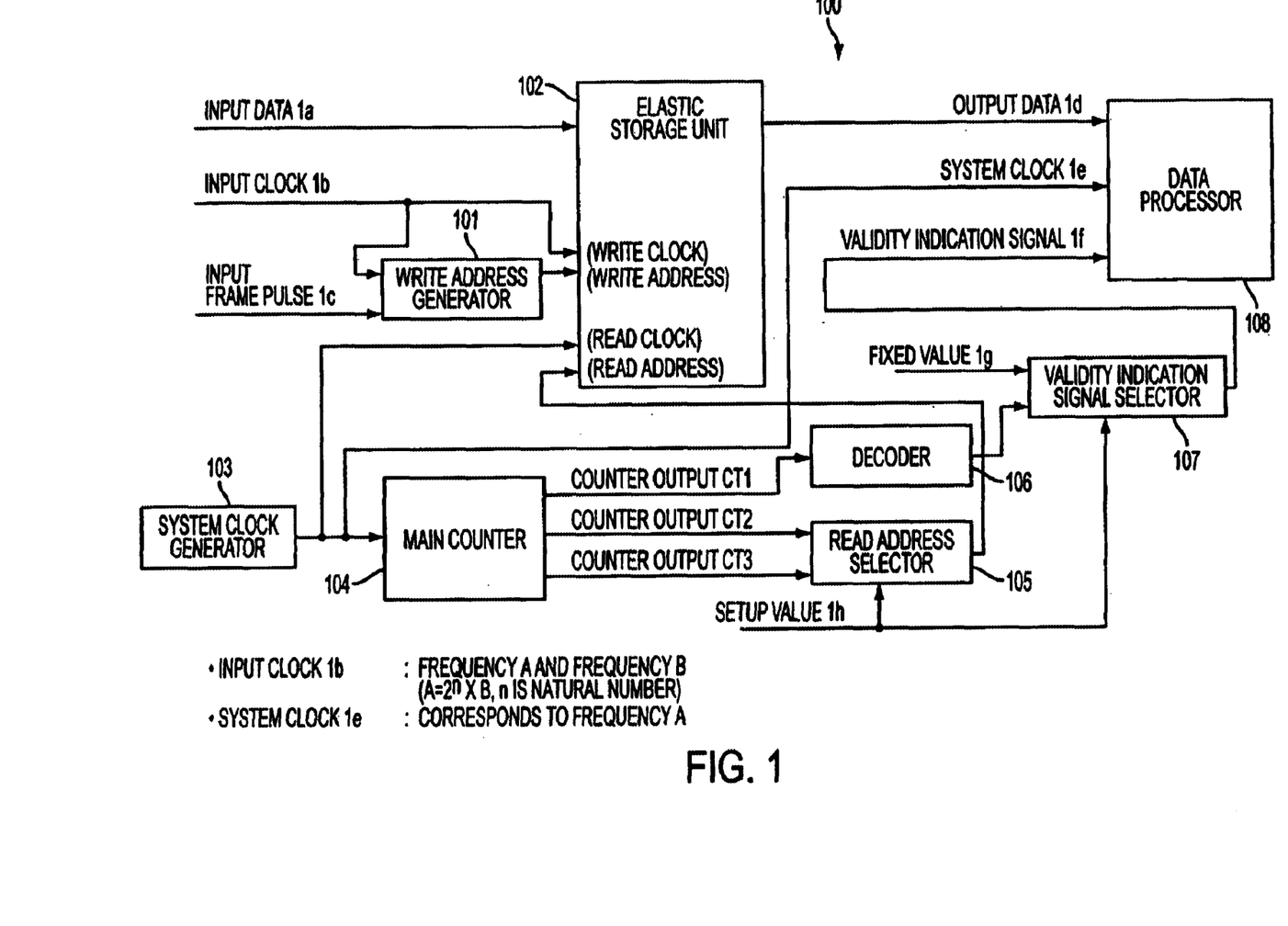
FIG. 1 is a block diagram, in accordance with a first embodiment, illustrating an arrangement of an elastic storage controller for which a clock switching circuit of the present invention is applied.

FIG. 1 is a block diagram, in accordance with the first embodiment, illustrating the arrangement of an elastic storage controller.

In FIG. 1, the system comprises: a write address generator 101, an elastic storage unit 102, a system clock generator 103, a main counter 104, a read address selector 105, a decoder 106, a validity indication signal selector 107, and a data processor 108. Of these components, the write address generator 101, the elastic storage unit 102, the main counter 104, the read address selector 105, the decoder 106 and the validity indication signal selector 107 constitute an elastic storage controller 100.

Input data $1a$ is transmitted as write data to the elastic storage unit 102. An input clock $1b$ is transmitted as a write clock to the elastic storage unit 102 and is also transmitted, as a clock for updating a write address, to the write address generator 101. And an input frame pulse $1c$ is transmitted as a re-timing pulse to the write address generator 101.

As is described above, the input data $1a$ is transmitted at either a high frequency A ($1b$) or a low clock frequency B ($1b$).

The write address generator 101, which is reset upon the receipt of the input frame pulse $1c$, generates a write address, which is incremented each time the input clock $1b$ is received, that it transmits to the elastic storage unit 102.

The system clock generator 103 generates a system clock $1e$, which is required by the internal component (the data processor 108) of the system that includes the elastic storage controller 100. In the first embodiment, the clock frequency of the system clock $1e$ is equal to the clock frequency A, which is the higher of the two frequencies provided for the input data.

The system clock $1e$ is transmitted as a read clock to the elastic storage unit 102, and is also transmitted to the main counter 104 and the data processor 108.

Upon the receipt of the system clock $1e$, the main counter 104 initiates a counting process and generates three count values, CT1 to CT3 (thereinafter referred to as counter outputs).

The range within which the counter outputs CT1 to CT3 can fall is determined by "n" and "i." In this case, "n" is a natural number used to establish the relationship $A=2^n*B$ between the input clock frequencies A and B, and "i" is a natural number that is determined by the address width (address bit count), defined as i−n+1, of the elastic storage unit 102. Since the address width i−n+1 is equal to or greater than two bits, i>n is established. And further, since the address width is i−n+1, the addresses are 0 to $2^{i-n+1}-1$.

The counter output CT1 is incremented by one each time a system clock $1e$ arrives, and is cyclically changed within a range spanning 0 to $2^n-1$. The unit for producing the counter output CT1 may be constituted using software, while if hardware is used, an n-bit counter can be employed.

The counter output CT2 is incremented by one each time a system clock $1e$ arrives, and is cyclically changed within a range spanning 0 to $2^{i-n+}-1$ (equal to the address range). The unit for forming the counter output CT2 may also be constituted using software, while if hardware is employed, an i−n+1 bit counter can be employed.

The counter output CT3 is incremented by one each time a $2^n$ system clock $1e$ arrives, and is cyclically changed within a range spanning 0 to $2^n-1$. Again, the unit for forming the counter output CT3 may be constituted using software, while if hardware is employed, an i+1 bit counter, which increments a counter value by one each time a system clock $1e$ arrives, can be employed, and the counter value, except for the lower n bits, output.

When the counter output CT3 is to be selected as the output of the i+1 bit counter by the read address selector 105, the lower n bits may be excluded from the counter output CT3 (by, for example, bit shifting to the lower position), and the upper i−n+1 bits may be output to the read address selector 105.

The counter outputs CT2 and CT3 are transmitted to the read address selector 105, and the counter output CT1 is transmitted to the decoder 106. It should be noted that the counter outputs CT1 and CT3 are significant when the clock frequency of the input data $1a$ is the low frequency B, while the counter output CT2 is significant when the clock frequency of the input data la is the high frequency A.

A setup value $1h$ can be easily obtained by detecting the clock frequency of the input clock $1b$ (e.g., by detecting the number of pulses in a predetermined period of time). Further, the setup value $1h$ can be set by identifying the clock frequency through negotiation before communication.

The elastic storage unit 102 stores the input data $1a$ in accordance with the received write clock $1b$ and the write address, and transmits its output data $1d$ to the data processor 108.

The decoder 106 decodes the counter output CT1, and transmits, to the validity indication signal selector 107, the output that is effective once every $2^n$ system clocks $1e$.

The setup value $1h$ is also provided for the validity indication signal selector 107, and a fixed value $1g$ is given that indicates a validity value. When the setup value $1h$ indicates that the clock frequency of the input clock $1b$ is the low frequency B, the validity indication signal selector 107 selects the output of the decoder 106 as a validity indication signal $1f$ and transmits it to the data processor 108. When the setup value $1h$ indicates that the clock frequency of the input clock $1b$ is the high frequency A, the validity indication signal selector 107 selects the fixed value $1g$, and transmits it as the validity indication signal $1f$ to the data processor 108.

When the received validity indication signal $1f$ represents validity, the data processor 108 fetches the output data $1d$ from the elastic storage unit 102 in synchronization with the system clock $1e$.

(A-2) Processing for the First Embodiment

The elastic storage controller 100 that is thus arranged, in accordance with the first embodiment, will now be described.

The input data $1a$, the input clock $1b$, and the input frame pulse $1c$ are transmitted as a group of signals to the elastic storage circuit 102.

As is described above, in this embodiment, the two types of clock frequencies A and B can be employed for these input signals, and have the powers of 2 relationship, i.e., $A=2^n*B$.

The input data $1a$ is communication channel data (e.g., a Bch signal for the ISDN) or a call signal (e.g., a Dch signal for the ISDN). The input data $1a$ is written in the elastic storage unit 102 while the input clock $1b$ is employed as a write clock. The input frame pulse $1c$ represents the head position of the input data $1a$, and is used for the re-timing of the counter in the write address generator 101. The write address generated by the write address generator 101 determines the address in the elastic storage unit 102 whereat the input data $1a$ is to be written.

The output data 1d is read from the output terminal of the elastic storage unit 102 while the system clock 1e, generated by the system clock generator 103, is employed as a read clock. As is described above, of the two clock frequencies for the input clock 1b, the clock frequency of the system clock 1e is the higher frequency A.

If the conventional elastic storage controller is employed when the high frequency A is selected as the read clock frequency (system clock 1e) and the lower frequency B is selected as the clock frequency of the input clock 1b, since the read clock frequency A will be higher than the write clock frequency B, the read address will pass the write address and the performance of a normal operation will not be possible.

In this embodiment, therefore, the read address is controlled in accordance with the lock frequency A or B of the input data 1a, so that the input data 1a of the two frequencies A and B can be handled.

An explanation will be given first for the processing performed on the reading side when the low frequency B input clock 1b is provided, and then for the processing on the reading side when the high frequency A input clock 1b is provided.

Figure 2A:
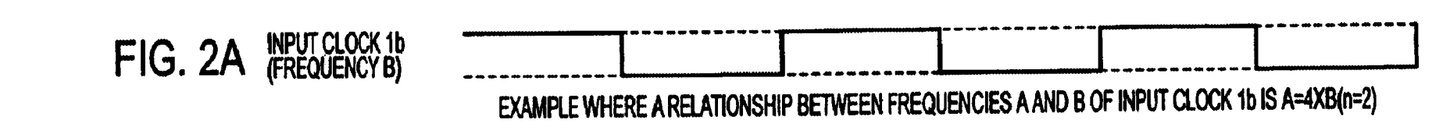
FIGS. 2A–2E are timing charts, in accordance with the first embodiment, showing a switching process for input data having a low clock frequency.
Figure 2B:
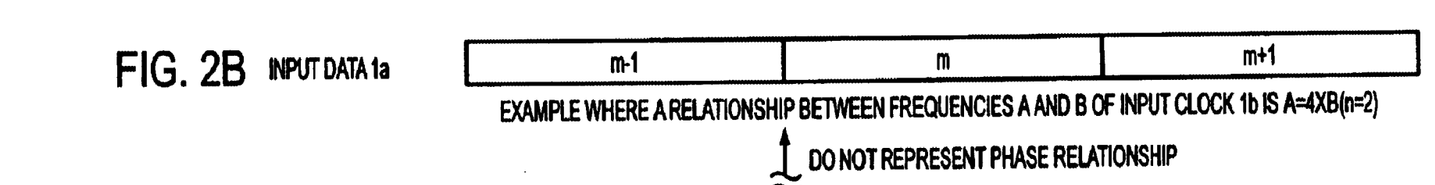
Figure 3A:
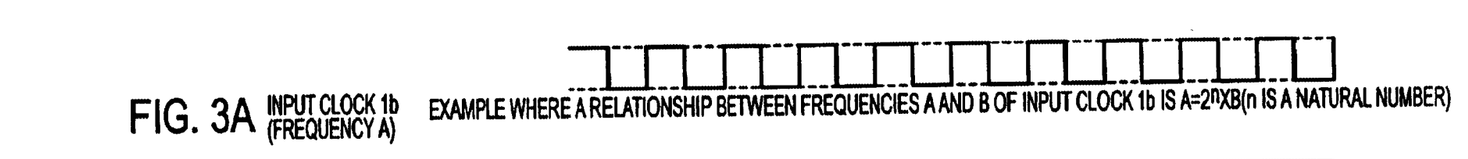
FIGS. 3A–3E are timing charts, in accordance with the first embodiment, showing a switching process for input data having a high clock frequency.
Figure 3B:
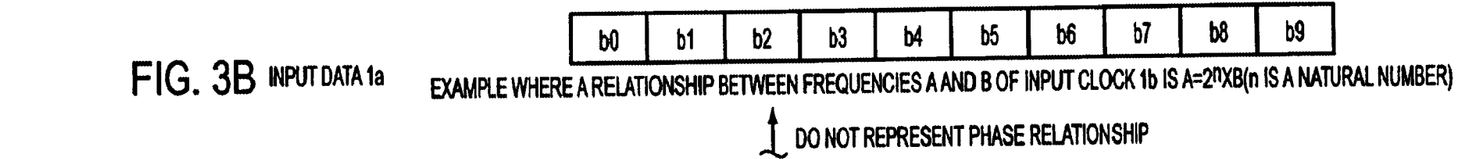

As is described above, the same processing is performed on the writing side when either the low frequency B or the high frequency A input clock 1b is provided. However, since the write clock frequency 1b differs, the time required for writing data one time is $2^n:1$. FIGS. 2A and 2B show the write timing when the low frequency B (n is 2) input clock 1b is provided, and FIGS. 3A and 3B show the write timing when the high frequency A input clock 1b is provided.

As is described above, when the low frequency B input clock 1b is provided, the high frequency A ($A=2^n*B$) system clock 1e is also read from the system clock generator 103 and is transmitted as a read clock to the elastic storage unit 102 and to the main counter 104.

Upon the receipt of the system clock 1e, the main counter 104 updates the counter outputs CT1 to CT3, and transmits the counter outputs CT2 and CT3 to the read address selector 105. Since the setup value 1h indicates the low frequency B of the input clock 1b, the read address selector 105 selects the counter output CT3, and transmits it as the read address to the elastic storage unit 102.

The counter output CT3 is, as described above, updated once every $2^n$ system clocks 1e. The read address is also updated once every $2^n$ system clocks 1e and the output data 1d is read. Since the system clock 1e is used as the read address, the same read address is employed for the $2^n$ reading operations.

Figure 2C:
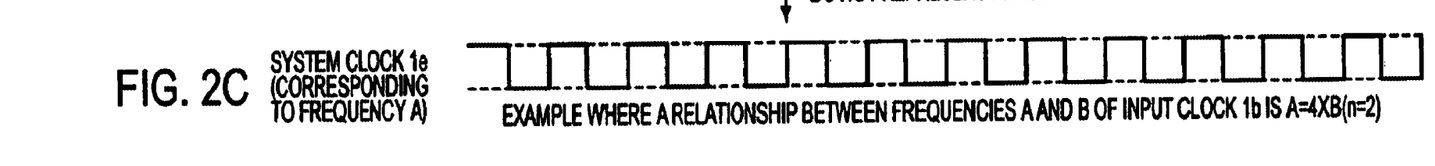
Figure 2D:
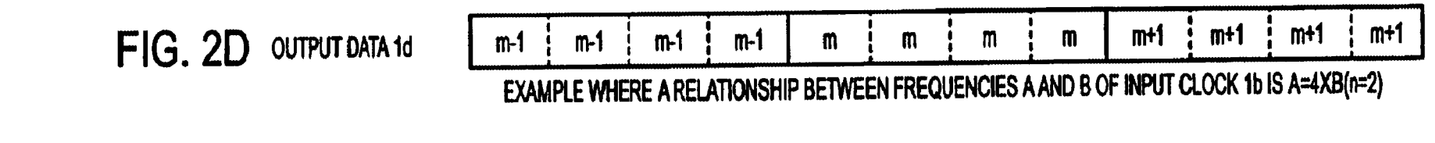

FIGS. 2C and 2D represent the reading state when n is 2.

As is described above, since the same data are repetitively output as the output data 1d during $2^n$ system clocks 1e, a signal must be output every $2^n$ system clocks 1e to notify the data processor 108 of the transmission of valid data.

Therefore, the counter output CT1 of the main counter 104 is decoded by the decoder 106, and a signal that indicates data is valid is output by the decoder 106 every $2^n$ clocks. This signal is selected by the validity indication signal selector 107 based on the setup value 1h that indicates that the low frequency B is used for the input clock 1b and that is output as the validity indication signal 1f to the data processor 108.

Figure 2E:
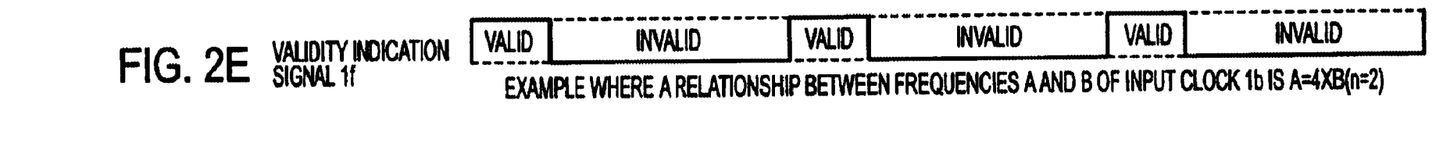

FIG. 2E represents the change in the validity indication signal 1f when n is 2.

Next, an explanation will be given for the processing on the reading side when the high frequency A is used for the input clock 1b, i.e., when the system clock 1e and the input clock 1b have the same frequency.

As is described above, in this processing also the system clock 1e output by the system clock generator 103 is transmitted as a read clock both to the elastic storage unit 102, and to the main counter 104. Upon the receipt of the system clock 1e, the main counter 104 updates all the counter outputs CT1 to CT3 and outputs the updated values.

The counter outputs CT2 and CT3 are transmitted to the read address selector 105, and since the setup value 1h indicates the clock frequency of the input clock b, of the high frequency A, the read address selector 105 selects the counter output CT2 and outputs it as a read address to the elastic storage unit 102.

As is described above, the counter output CT2 is incremented by one upon the arrival of each system clock 1e (when the maximum count by the counter output CT2 is reached, the count is returned to the minimum value). Thus, putting the phase aside, the cycle and the order for the updating of the write address are the same as those for the read address.

That is, without overlapping, the data written in the elastic storage unit 102 are read in the order that they were written, and are transmitted as the output data 1d to the data processor 108.

When the clock frequency of the input clock 1b is the high frequency A, the validity indication signal selector 107 also receives data from the decoder 106. However, based on the setup value 1h, which represents the high frequency A of the input clock 1b, the validity indication signal selector 107 does not select the data from the decoder 106, but instead, selects the fixed value 1g that constantly indicates data are valid, and transmits it as the validity indication signal 1f to the data processor 108.

Figure 3C:
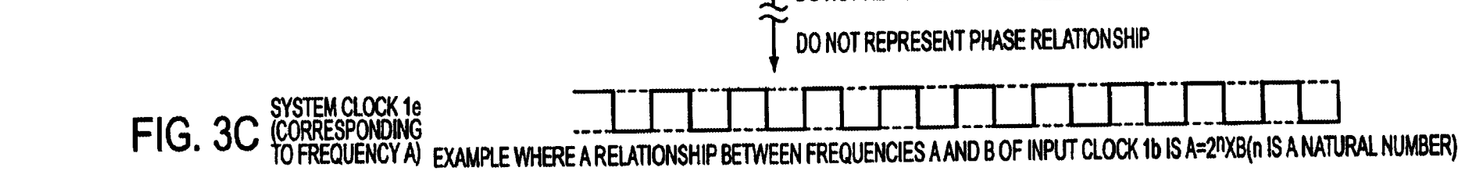
Figure 3D:
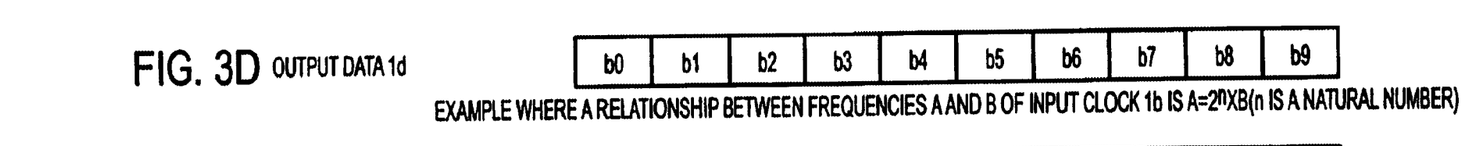
Figure 3E:
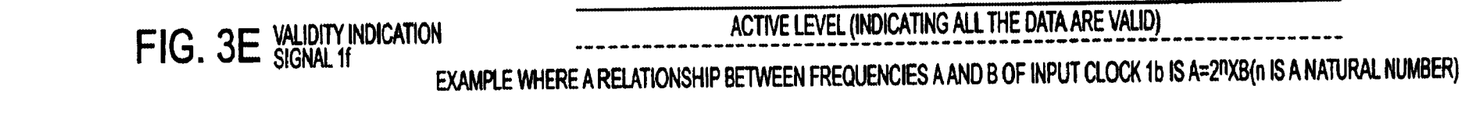

FIGS. 3C to 3E represent the timings for the system clock 1e, the output data 1d of the elastic storage unit 102, and the validity display signal 1f when the clock frequency of the input clock 1b is the high frequency A.

As is described above, since the setup value 1h is set in accordance with the clock frequency of the input data 1a, the input data 1a can be switched to the system clock 1e, regardless of whether the clock frequency of the input data 1a is the high frequency A or the low frequency B.

In either case, the output data 1d from the elastic storage unit 102, and the system clock 1e and the validity indication signal 1f are transmitted to the data processor 108, and based on these signals, the data are efficiently processed. For example, the time-sharing multiplex separation process, the time-sharing exchange process or the call setting process can be efficiently performed.

(A-3) Effects of the First Embodiment

According to the elastic storage controller in the first embodiment, by the employment of a simple arrangement, input data having different clock frequencies (a power of 2 relationship is established between the frequencies) can be switched to the system clock.

Further, since the validity indication signal is also transmitted to the circuit at the following stage, the data processing can be performed with the assumption that different clock frequencies will be input. The circuits provided following the elastic storage unit can be used in common, and an efficient process can be performed by these following circuits.

(B) Second Embodiment

An explanation will now be given, while referring to the accompanying drawings, for an elastic storage controller according to a second embodiment for which a clock switching circuit according to the present invention is applied.

For a system that processes, as a phase synchronization target, input data that are synchronized with two different clock frequencies, the elastic storage controller according to the second embodiment implements a phase synchronization method when an integer ratio relationship is established between the two clock frequencies (x*C=y*D (x and y are natural numbers) is established where C and D denote input clock frequencies).

(B-1) Arrangement of the Second Embodiment

Figure 4:
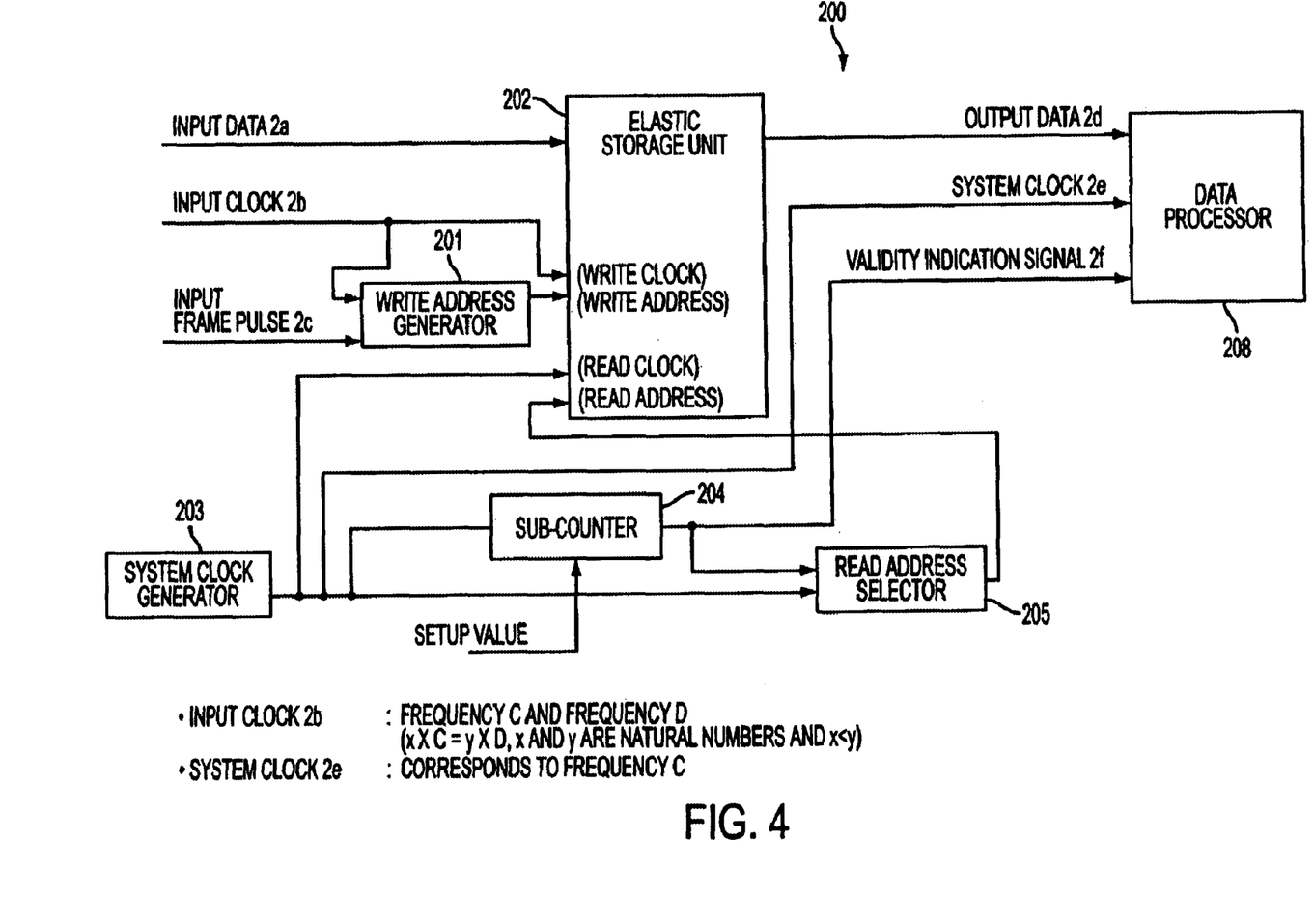
FIG. 4 is a block diagram, in accordance with a second embodiment, illustrating an arrangement of an elastic storage controller for which a clock switching circuit of the present invention is applied.

FIG. 4 is a block diagram illustrating the arrangement of an elastic storage controller according to the second embodiment.

In FIG. 4, the system comprises: a write address generator 201, an elastic storage unit 202, a system clock generator 203, a sub-counter 204, a read address selector 205, and a data processor 208. Of these components, the write address generator 201, the elastic storage unit 202, the sub-counter 204 and the read address selector 205 constitute an elastic storage controller 200.

In FIG. 4, input data 2a is transmitted as write data to the elastic storage unit 202. An input clock 2b is transmitted as a write clock to the elastic storage unit 202 and is also transmitted to the wire address generator 201 to update a write address, and an input frame pulse 2c is transmitted as a re-timing pulse to the write address generator 201. The data from the write address generator 201 is transmitted as a write address to the elastic storage unit 202.

The system clock generator 203 generates a system clock 2e having the same frequency as the frequency C that is higher than the frequency D, the two of which are available for use with the input clock 2b. The system clock 2e is transmitted as a read clock to the elastic storage unit 202 and is also transmitted to the sub-counter 204, the read address generator 205 and the data processor 208.

A setup value 2h is provided for the sub-counter 204 to define the frequency C or D as the frequency for the input clock 2b that is transmitted to the elastic storage controller.

When the setup value 2h indicates the high frequency C, the sub-counter 204 consistently forms a validity indication signal 2f that constantly indicates data are valid, regardless of whether the system clock 2e is received. When the setup value 2h indicates the low frequency D, the sub-counter 204 forms a validity indication signal 2f that indicates data are valid during the arrival of x out of y system-clocks 2e, and forms the validity indication signal 2f that indicates data are invalid during the arrival of y-x system clocks 2e. For example, the validity indication signal 2f indicates data are invalid in the first period during the arrival of y-x system clocks 2e, and is transmitted to the read address generator 205 and the data processor 208. In the above explanation, x and y are employed to establish a relationship of x*C=7*D between the two frequencies C and D of the input clock 2b.

In a period during which data are valid is indicated by the validity indication signal 2f, the read address generator 205 increments the count value by one in accordance with the receipt of a system clock 2e (when the maximum count is reached, upon the receipt of a system clock 2e the count is returned to the minimum value). The count value is thereafter transmitted as a read address to the elastic storage unit 202.

The elastic storage unit 202 stores the input data 2a in accordance with the received write clock 2b and the write address, and transmits its output data 2d to the data processor 208.

When the validity indication signal 2f indicates data are valid, the data processor 208 fetches and processes the data 2d output by the elastic storage unit 202 in synchronization with the system clock 2e.

(B-2) Processing for the Second Embodiment

The elastic storage controller 200 that is thus arranged, in accordance with the second embodiment, will now be described.

In this embodiment, the input data 2a, the input clock 2b and the input frame pulse 2c are transmitted as a group of signals to the elastic storage circuit 100.

As is described above, in this embodiment, the two different clock frequencies C and D can be employed for these input signals, and the integer ratio relationship is established between them (x*C=y*D, x and y are natural numbers and x<y).

The input data 2a is communication channel data (e.g., a Bch signal for the ISDN) or a call signal (e.g., a Dch signal for the ISDN). The input data 2a is written in the elastic storage unit 202 while the input clock 2b is employed as a write clock. The input frame pulse 2c represents the head position of the input data 2a, and is used for the re-timing of the counter in the write address generator 201. The write address generated by the write address generator 201 determines the address in the elastic storage unit 202 whereat the input data 2a is to be written.

The output data 2d is read from the output terminal of the elastic storage unit 202 while the system clock 2e, generated by the system clock generator 203, is employed as a read clock.

The clock frequency of the system clock 2e is the higher frequency C of the two clock frequencies C and D provided for the input clock 2b.

If the conventional elastic storage controller is employed when the lower frequency D is selected as the frequency for the input clock 2b, and the system clock 2e having the same frequency as the higher frequency C is selected as the read clock, the read clock frequency is higher than the write clock frequency, and the read address will pass the write address and the performance of a normal operation will not be possible.

Therefore, also in this embodiment the read address is controlled in accordance with the clock frequency C or D of the input data 2a, so that the input data 2a for the different frequencies can be handled.

An explanation will first be given for the processing on the reading side when the low frequency D is used for the input clock 2b, and then for the processing on the reading side when the high frequency C is used for the input clock 2b.

Figure 5A:
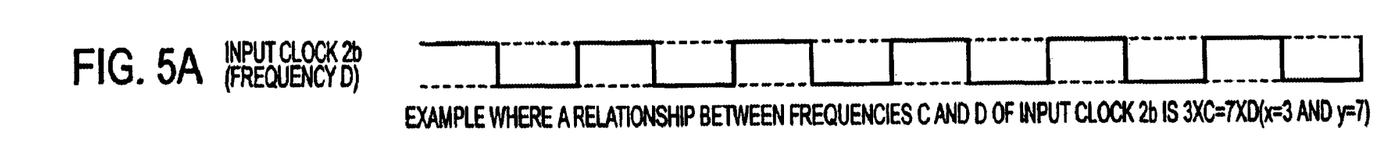
FIGS. 5A–5E are timing charts, in accordance with the second embodiment, showing a switching process for input data having a low clock frequency.
Figure 5B:
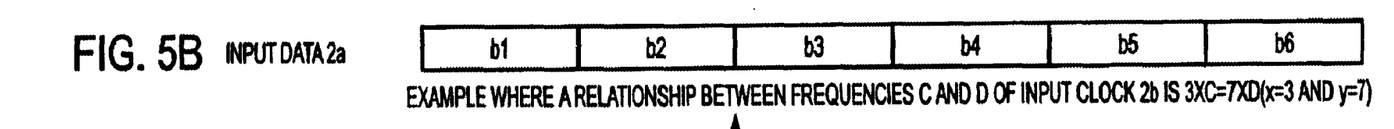
Figure 5C:
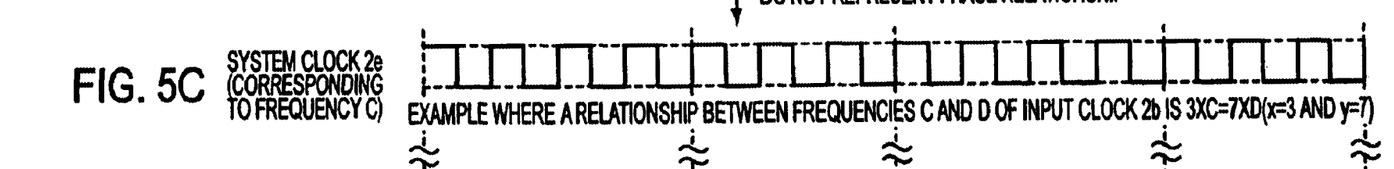
Figure 5D:
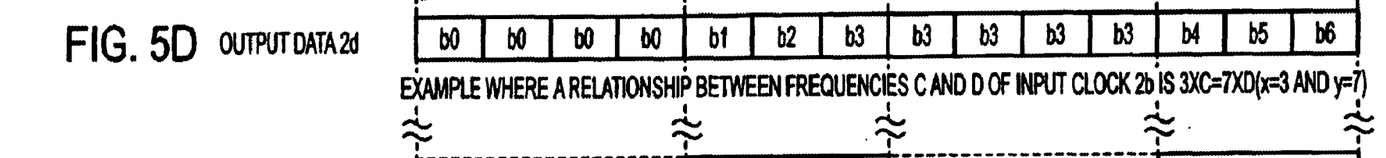
Figure 6A:
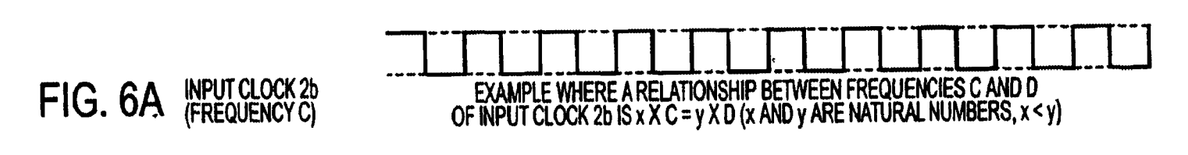
FIGS. 6A–6E are timing charts, in accordance with the second embodiment, showing a switching process for input data having a high clock frequency.
Figure 6B:
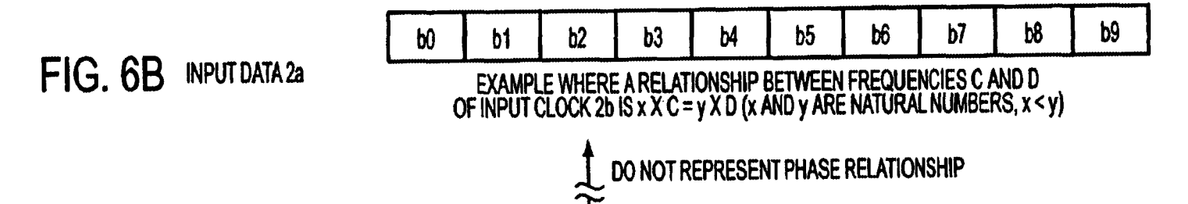
Figure 6C:
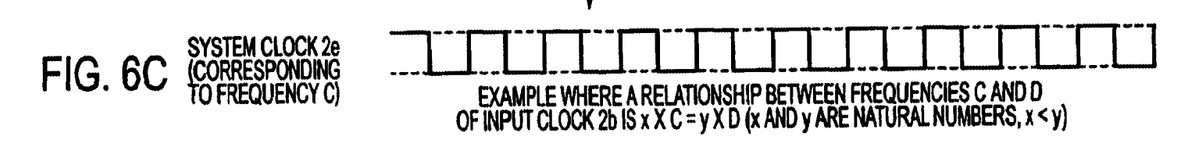

Similarly in this embodiment, the same processing is performed on the writing side when either the low frequency D or the high frequency C is provided for the input clock 2b. However, since the write clock frequency 2b differs, the time required for writing data one time is y:x. FIGS. 5A and 5B represent the write timing when the low frequency D is provided for the input clock 2b, and FIGS. 6A and 6B represent the write timing when the high frequency C (x=3 and y=7) is provided for the input clock 2b.

As is described above, when the low frequency D is provided for the input clock 2b, the system clock 2e for which the high frequency C (x*C=y*D) is provided is also read from the system clock generator 203, and is then transmitted as a read clock to the elastic storage unit 202, as well as to the sub-counter 204 and the read address generator 205.

When the frequency of the system clock 2e is y/x (>1) times the frequency of the input clock 2b, i.e., when the clock frequency for the input clock 2b is the low frequency D, based on the setup value 2h to that effect, the sub-counter 204 generates the validation indication signal 2f that indicates data are valid during a period of x of y system clocks 2e, and that indicates data are invalid during a y-x clock period. The internal counter of the read address generator 205 updates the count value (the read address for the elastic storage unit 202) in accordance with the system clocks 2e that have arrived during the period wherein the validity indication signal 2f indicated data were valid. During the period wherein the validity indication signal 2f indicated data were invalid, the count value is not updated, even when a system clock 2e is received.

In this case, x and y are values used to define the relationship existing between the frequencies C and D for the input clock 2b (x*C=y*D, where x and y are natural numbers and x<y).

Figure 5E:
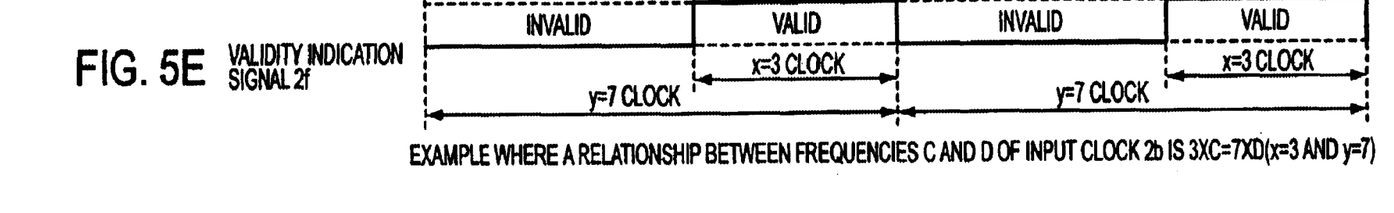

As is shown in the time chart in FIG. 5, the read address is updated only during a period equivalent to x of y system clocks 2e (see FIG. 5E). As a result, as is shown in FIG. 5D, the output data 2d overlaps data from the same address during a y-x clock periods for which the validity indication signal 2f from the sub-counter 204 indicates data are invalid. Thus, the data processor 208 must be notified that valid data are transmitted during a period equivalent to x of y system clocks 2e. Therefore, the validity indication signal 2f that is generated by the sub-counter 204 is also transmitted to the data processor 208, which employs the validity indication signal 2f to perform data processing.

Next, an explanation will be given for the processing on the reading side when the high frequency C is provided for the input clock 2b, i.e., when the same clock frequency is provided for the system clock 2e and the input clock 2b.

As is described above, as well as in this processing, the system clock 2e output by the system clock generator 203 is transmitted as a read clock to the elastic storage unit 202, and is also transmitted to the sub-counter 204, the read address generator 205 and the data processor 208.

Figure 6D:
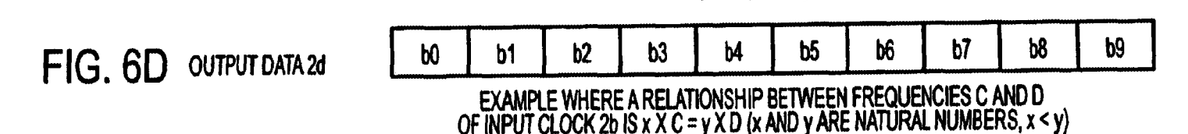
Figure 6E:
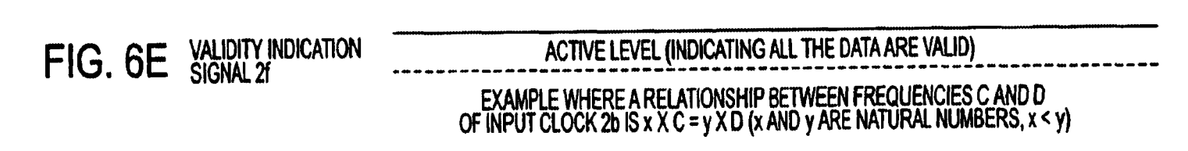

In this case, since the setup value 2h indicates that the clock frequency of the input clock 2b is the high frequency C, as is shown in FIG. 6E, the sub-counter 204 consistently outputs the validity indication signal indicating that data are valid, regardless of the input of the system clock 2e in FIG. 6D. As a result, the internal counter of the read address generator 205 is not halted and updates the read address, and each time the read clock (system clock 2e) is generated, as is shown in FIG. 6D, data that is stored at the updated read address is read from the elastic storage unit 202 as the output data 2d.

As is described above, since each time the read clock is generated, different data are output as output data 2d by the elastic storage unit 202 to the data processor 208, the validity indication signal 2f that constantly indicates data are valid is also transmitted to the data processor 208 as notification that the input data 2d does not include overlapped invalid data.

When the setup value 2h is determined in advance in accordance with the clock frequency of the input data 2a in the above described manner, either the frequency C or D (x*C=y*D, where x and y are natural numbers and x<y) can be employed as the clock frequency for the input data 2a.

The output data 2d from the elastic storage unit 202, and the system clock 2e and the validity indication signal 2f are transmitted to the data processor 208, and based on these signals, the data are efficiently processed. For example, the time-sharing multiplex separation process, the time-sharing exchange process or the call setting process can be efficiently performed.

(B-3) Effects of the Second Embodiment

According to the elastic storage controller in the second embodiment, using a simple arrangement, the data that are stored in the elastic storage unit in accordance with one of several different clock frequencies (an integer ratio relationship is established between the frequencies) can be switched to the system clock. As a result, the circuits following the elastic storage controller can be used in common.

Further, since a signal is generated that indicates the position of overlapped invalid data that is caused when the frequency of the system clock is higher than the frequency of the input clock, efficient processing can be performed by the circuit at the following stage.

(C) Another Embodiment

In the first and the second embodiments, the frequency of one of two input clocks is set the same as the system clock frequency. In principle, the frequency need not be the same, and the present invention can be applied when all of the clocks, the two input clocks and the system clock, have different frequencies. It should be noted that the system clock must have the highest frequency.

In this case, assuming that the frequencies of the two input clocks are E and F and the frequency of the system clock is G, either the method in the first embodiment for switching the input data of the clock frequency B to the system clock, or the method in the second embodiment for changing the input data for the clock frequency D to the system clock is employed to switch the input data both of the clock frequency E and the clock frequency F to the system clock.

In addition, two frequencies are available for the input clock in the first and the second embodiments; however, when multiple setup values are set in advance, the present invention can be applied for three or more frequencies. And further, even when only one frequency is available for the input clocks, if that frequency is lower than the system clock frequency, the arrangement in the above embodiments can be employed that can cope with a case wherein input clocks having low frequency are transmitted.

In the first and the second embodiments, when the input data for a low clock frequency is received, the read address is updated once in a period covering of $2^n$ system clocks, or x times in a period covered by y system clocks. So long as this updating ratio can be obtained, another method may be employed. For example, as a modification for the second embodiment, the read address may be collectively updated 2x times in the second half of the period covered by 2y system clocks. And it is natural that the validity and the invalidity of the validity indication signal be controlled in accordance with the updating of the read address.

Further, in the second embodiment, an integer ratio relationship is established between the two input clock frequencies. Since such an integer ration relationship includes a powers of 2 relationship, the second embodiment can be applied for a case where a powers of 2 relationship is established between the two input clock frequencies.

Furthermore, in the first and the second embodiments, the clock switching circuit of the invention is applied for the elastic storage controller. However, the clock switching circuit of the invention can be applied for a circuit that requires the switching of another clock. In this case, input data is not limited to serial data (one-bit data), and parallel data that is input in synchronization with an input clock (pre-switched clock) may be switched to the system clock (post-switched clock).

As is described above, according to the first embodiment, a clock switching circuit can be provided that can switch clocks even when the frequency of the post-switched clock is higher than the frequency of the pre-switched clock.

Further, according to the second embodiment, a clock switching circuit can be provided that can switch multiple types of input data having different clock frequencies to a post-switched clock having a predetermined frequency.

What is claimed is:

1. A clock switching circuit comprising:

writing means for generating a write address based on a pre-switched clock, and for employing said write address to store input data in storage means; and reading means for generating a read address based on a post-switched clock that is independent of said pre-switched clock, and for employing said read address to read data from said storage means, thus changing a clock that is synchronized with said data, wherein said reading means includes a validity indication signal generator for generating a validity indication signal that indicates data is valid during a period in which said read address is the same and that corresponds to one cycle of said post-switched clock, and for transmitting said validity indication signal to a data processor that receives data read from said storage means, wherein the frequency of said post-switched clock is higher than the frequency of said pre-switched clock, and wherein, upon the receipt of said post-switched clock, said reading means updates or maintains said read address, in accordance with a ratio of said frequency of said pre-switched clock to said frequency of said post-switched clock.

2. A clock switching circuit according to claim 1, wherein said frequency of said post-switched clock is $2^n$ (n is a natural number) times said frequency of said pre-switched clock; and wherein said reading means updates said read address $2^n$ times before said post-switched clock arrives.

3. A clock switching circuit according to claim 1, wherein said frequency of said post-switched clock is C and said frequency of said pre-switched clock is D, and a relationship $x*C=y*D$ (x and y are natural numbers; x<y) is established; and wherein, upon the receipt of x of y post-switched clocks, said reading means updates said read address.

4. A clock switching circuit according to claim 3, wherein said validity indication signal generator, upon the receipt of y post-switched clocks, generates a validity indication signal that indicates data is valid during a period covered by x out of said y post-switched clocks, and transmits said validity indication signal to said data processor that receives data read from said storage means.

5. A clock switching circuit comprising:

writing means for generating a write address based on a pre-switched clock, and for employing said write address to store input data in storage means; and reading means for generating a read address based on a post-switched clock that is independent of said pre-switched clock, and for employing said read address to read data from said storage means, thus changing a clock that is synchronized with said data, wherein said reading means includes a validity indication signal generator for, when said frequency of said post-switched clock is $2^n$ times said frequency of said pre-switched clock that is input, generating a validity indication signal that indicates data is valid during a period in which said read address is the same and that corresponds to one cycle of said post-switched clock, and for transmitting said validity indication signal to a data processor that receives data read from said storage means, wherein a plurality of frequencies are employed for said pre-switched clock, and the frequency of said post-switched clock is equal to or higher than the highest frequency of said pre-switched clock, and wherein, when the frequency of said pre-switched clock that is input is lower than said frequency of said post-switched clock, upon the receipt of said post-switched clock, said reading means updates or maintains said read address, in accordance with a ratio of said frequency of said pre-switched clock to said frequency of said post-switched clock.

6. A clock switching circuit according to claim 5, wherein, when said frequency of said post-switched clock is $2^n$ (n is a natural number) times said frequency of said pre-switched clock that is input, said reading means updates said read address $2^n$ times before said post-switched clock arrives.

7. A clock switching circuit according to claim 5, wherein, when a relationship $x*C=y*D$ (x and y are natural numbers; x<y) is established and C denotes said frequency of said post-switched clock and D denotes said frequency of said pre-switched clock that is input, upon the receipt of x of y post-switched clocks, said reading means updates said read address.

8. A clock switching circuit according to claim 7, wherein said validity indication signal generator generates a validity indication signal that indicates data is valid in a period equivalent to x of y post-switched clocks that are received, and transmits said validity indication signal to said data processor that receives data read from said storage means.

9. A clock switching circuit comprising:

a write address generator for generating a write address based on a pre-switched clock, and for employing said write address to store input data in a memory; and a read address generator for generating a read address based on a post-switched clock that is independent of said pre-switched clock, and for employing said read address to read data from said memory, thus changing a clock that is synchronized with said data, wherein said read address generator includes a validity indication signal generator for generating a validity indication signal that indicates data is valid during a period in which said read address is the same and that corresponds to one cycle of said post-switched clock, and for transmitting said validity indication signal to a data processor that receives data read from said memory, wherein the frequency of said post-switched clock is higher than the frequency of said pre-switched clock, and wherein, upon the receipt of said post-switched clock, said read address generator updates or maintains said read address, in accordance with a ratio of said frequency of said pre-switched clock to said frequency of said post-switched clock.

10. A clock switching circuit comprising:

a write address generator for generating a write address based on a pre-switched clock, and for employing said write address to store input data in a memory; and a read address generator for generating a read address based on a post-switched clock that is independent of said pre-switched clock, and for employing said read address to read data from said memory, thus changing a clock that is synchronized with said data, wherein said read address generator includes a validity indication signal generator for, when said frequency of said post-switched clock is $2^n$ times said frequency of said pre-switched clock that is input, generating a validity indication signal that indicates data is valid during a period in which said read address is the same and that corresponds to one cycle of said post-switched clock, and for transmitting said validity indication signal to a data processor that receives data read from said memory, wherein a plurality of frequencies are employed for said pre-switched clock, and the frequency of said post-switched clock is equal to or higher than the highest frequency of said pre-switched clock, and wherein, when the frequency of said pre-switched clock that is input is lower than said frequency of said post-switched clock, upon the receipt of said post-switched clock, said read address generator updates or maintains said read address, in accordance with a ratio of said frequency of said pre-switched clock to said frequency of said post-switched clock.

11. A clock switching circuit comprising:

writing means for generating a write address based on a pre-switched clock, and for employing said write address to store input data in storage means; and reading means for generating a read address based on a post-switched clock that is independent of said pre-switched clock, and for employing said read address to read data from said storage means, thus changing a clock that is synchronized with said data, wherein said reading means includes a validity indication signal generator for, upon the receipt of y post-switched clocks, generating a validity indication signal that indicates data is valid during a period covered by x out of said y post-switched clocks (x and y are natural numbers; x<y), and for transmitting said validity indication signal to a data processor that receives data read from said storage means, wherein the frequency of said post-switched clock is higher than the frequency of said pre-switched clock, and wherein, upon the receipt of said post-switched clock, said reading means updates or maintains said read address, in accordance with a ratio of said frequency of said pre-switched clock to said frequency of said post-switched clock.

12. A clock switching circuit according to claim 11, wherein said frequency of said post-switched clock is C and said frequency of said pre-switched clock is D, and a relationship $x*C=y*D$ is established; and wherein, upon the receipt of x of y post-switched clocks, said reading means updates said read address.

13. A clock switching circuit comprising:

writing means for generating a write address based on a pre-switched clock, and for employing said write address to store input data in storage means; and reading means for generating a read address based on a post-switched clock that is independent of said pre-switched clock, and for employing said read address to read data from said storage means, thus changing a clock that is synchronized with said data, wherein said reading means includes a validity indication signal generator for, when a relationship $x*C=y*D$ (x and y are natural numbers; x<y) is established and C denotes said frequency of said post-switched clock and D denotes said frequency of said pre-switched clock that is input, generating a validity indication signal that indicates data is valid in a period equivalent to x of y post-switched clocks that are received, and for transmitting said validity indication signal to a data processor that receives data read from said storage means, wherein a plurality of frequencies are employed for said pre-switched clock, and the frequency of said post-switched clock is equal to or higher than the highest frequency of said pre-switched clock, and wherein, when the frequency of said pre-switched clock that is input is lower than said frequency of said post-switched clock, upon the receipt of said post-switched clock, said reading means updates or maintains said read address, in accordance with a ratio of said frequency of said pre-switched clock to said frequency of said post-switched clock.

14. A clock switching circuit according to claim 13, wherein upon the receipt of x of y post-switched clocks, said reading means updates said read address.

15. A clock switching circuit comprising:

a write address generator for generating a write address based on a pre-switched clock, and for employing said write address to store input data in a memory; and a read address generator for generating a read address based on a post-switched clock that is independent of said pre-switched clock, and for employing said read address to read data from said memory, thus changing a clock that is synchronized with said data, wherein said reading means includes a validity indication signal generator for, upon the receipt of y post-switched clocks, generating a validity indication signal that indicates data is valid during a period covered by x out of said y post-switched clocks (x and y are natural numbers; x<y), and for transmitting said validity indication signal to a data processor that receives data read from said memory, wherein the frequency of said post-switched clock is higher than the frequency of said pre-switched clock, and wherein, upon the receipt of said post-switched clock, said read address generator updates or maintains said read address, in accordance with a ratio of said frequency of said pre-switched clock to said frequency of said post-switched clock.

16. A clock switching circuit according to claim 15, wherein said frequency of said post-switched clock is C and said frequency of said pre-switched clock is D, and a relationship $x*C=y*D$ is established; and wherein, upon the receipt of x of y post-switched clocks, said reading means updates said read address.

17. A clock switching circuit comprising:

a write address generator for generating a write address based on a pre-switched clock, and for employing said write address to store input data in a memory; and a read address generator for generating a read address based on a post-switched clock that is independent of said pre-switched clock, and for employing said read address to read data from said memory, thus changing a clock that is synchronized with said data, wherein said read address generator includes a validity indication signal generator for, when a relationship x*C=y*D (x and y are natural numbers; x<y) is established and C denotes said frequency of said post-switched clock and D denotes said frequency of said pre-switched clock that is input, generating a validity indication signal that indicates data is valid in a period equivalent to x of y post-switched clocks that are received, and for transmitting said validity indication signal to a data processor that receives data read from said memory, wherein a plurality of frequencies are employed for said pre-switched clock, and the frequency of said post-switched clock is equal to or higher than the highest frequency of said pre-switched clock, and wherein, when the frequency of said pre-switched clock that is input is lower than said frequency of said post-switched clock, upon the receipt of said post-switched clock, said read address generator updates or maintains said read address, in accordance with a ratio of said frequency of said pre-switched clock to said frequency of said post-switched clock.

18. A clock switching circuit according to claim 17, wherein upon the receipt of said x of said y post-switched clocks, said reading means updates said read address.

* * * * *